United States Patent [19]

Ishihara et al.

[11] Patent Number: 4,764,486
[45] Date of Patent: Aug. 16, 1988

[54] SINTERED GLASS-POWDER PRODUCT

[75] Inventors: Masayuki Ishihara, Neyagawa; Keizo Makio, Shijonawate, both of Japan

[73] Assignee: Matsushita Electric Works, Ltd., Osaka, Japan

[21] Appl. No.: 4,198

[22] Filed: Jan. 16, 1987

[30] Foreign Application Priority Data

Jan. 23, 1986 [JP] Japan .................................. 61-13357
Mar. 15, 1986 [JP] Japan .................................. 61-57341

[51] Int. Cl.$^4$ ............................................. C03C 10/00
[52] U.S. Cl. ......................................... 501/9; 501/66; 501/69; 501/70; 501/153
[58] Field of Search ................... 501/9, 52, 66, 69–70, 501/153

[56] References Cited

U.S. PATENT DOCUMENTS

| | | | |
|---|---|---|---|
| 3,205,079 | 9/1965 | Stookey | 501/9 |
| 3,873,329 | 3/1975 | Beall | 501/9 |
| 3,997,351 | 12/1976 | Vergano et al. | 501/9 |
| 4,301,324 | 11/1981 | Kumar et al. | 174/68.5 |
| 4,358,541 | 11/1982 | Andrus et al. | 501/9 |
| 4,409,337 | 10/1983 | Dumbaugh, Jr. | 501/66 |
| 4,413,061 | 11/1983 | Kumar et al. | 501/7 |
| 4,451,516 | 5/1984 | Kato | 501/9 |
| 4,540,671 | 9/1985 | Kondo et al. | 501/9 |
| 4,650,923 | 3/1987 | Nishigaki et al. | 501/73 |

FOREIGN PATENT DOCUMENTS

| | | | |
|---|---|---|---|
| 247441 | 9/1960 | Australia | 501/9 |
| 799407 | 11/1968 | Canada | 501/9 |
| 2533871 | 2/1976 | Fed. Rep. of Germany | 501/9 |
| 1539188 | 9/1968 | France | 501/9 |
| 20832 | 12/1966 | Japan | 501/9 |
| 1020573 | 2/1966 | United Kingdom | 501/9 |
| 1215478 | 12/1970 | United Kingdom | 501/9 |

OTHER PUBLICATIONS

*Dictionary of Ceramic Science and Engineering*, Coran O'Bannon, 1984 Plenum Press p. 160.

Primary Examiner—William R. Dixon, Jr.
Assistant Examiner—Andrew Griffis
Attorney, Agent, or Firm—Burns, Doane, Swecker & Mathis

[57] ABSTRACT

A sintered glass-powder product of a glass ceramic body, consisting essentially of: $SiO_2$, $Al_2O_3$, MgO, and $B_2O_3$, and sintered at a temperature below 900° C. The product includes a microstructure of alpha-cordierite and magnesium aluminum silicate ($MgO.Al_2O_3.4SiO_2$) homogeneously dispersed in the glass ceramic body. When the sintered glass-powder product is used in the form of a green sheet for fabricating, in particular, a multilayer wiring substrate or the like, the required sintering temperature for fabricating the substrate can be remarkably reduced so as to be well-matched in thermal characteristics with such wiring conductors as gold, silver, copper, or the like, and even with a relatively large semiconductor chip because the thermal expansion coefficient of the sintered product is close to that of silicon semiconductor.

7 Claims, 1 Drawing Sheet

SINTERED GLASS-POWDER PRODUCT

BACKGROUND OF THE INVENTION

This invention relates to a sintered glass-powder product obtained by sintering a molded member of crushed glass powder.

The sintered glass-powder product is effectively utilized in fabricating such insulating materials as multilayer wiring substrates on which many highly integrated LSI's are mounted, because the product can be prepared and sintered together with low-resistance alloys or metals such as silver, silver-palladium, gold or the like.

Because of an increasing demand for miniaturization and the higher reliability of multilayer wiring substrates on which many elements including highly integrated LSI's are mounted, multilayer wiring substrates made of ceramic material have been increasingly utilized. In fabricating such a multilayer wiring substrate, a conductor wiring pattern of Mo, W, or a similar metal having a high melting point is initially print-molded by means of a known thick-film technique into the shape of a green sheet with alumina as a main component. A plurality of such green sheets are then stacked and joined into a multilayer green sheet assembly, and the assembly is sintered within a non-oxidizing atmosphere at a high temperature of about 1,500° to 1,600° C.

The foregoing multilayer wiring substrate having alumina as its main component has been unsuitable for high speed signal processing because of the relatively high dielectric constant of alumina and because the very thin wiring pattern of a metal high in resistance and melting point make the transmission time of signals propagating through the wiring pattern of the substrate too long. It may be possible for the metal high in resistance and melting point to be replaced by a lower resistance metal or alloy such as Au, Ag, Ag-Pd, Cu or the like in forming the wiring pattern. Since the low resistance metal material generally has a melting point of about 1,000° C. or less, which is much lower than the sintering temperature of alumina, there arises the problem that the wiring pattern cannot follow any shrink of the green sheet during the sintering of the sheet so as to result in an open-circuiting of the conductor wiring.

In using the low resistance metal material for high speed signal processing, on the other hand, there has been suggested a multilayer wiring substrate of a sintered glass-powder product (glass ceramic product) for eliminating the foregoing problem, as disclosed in, for example, U.S. Pat. No. 4,301,324 to Ananda H. Kumar et al. and U.S. Pat. No. 4,413,061, a division of the former. There, a raw material containing 48 to 55 wt % of $SiO_2$, 18 to 25 wt % of $Al_2O_3$, 18 to 25 wt % of MgO, a small amount of nucleant selected from a group consisting of ZnO, $P_2O_5$, $TiO_2$, $SnO_2$ and $ZrO_2$, and less than 4 Wt % of $B_2O_3$ are sintered at a temperature of 925° to 1,050° C. so that microcrystalline networks of alpha-cordierite are generated with the residual glass containing microcrystalline clinoenstatite located in interstices of the networks.

According to Kumar et al., the wiring pattern can be prevented from being subjected to the open-circuit during the sintering of the green sheet, since the sintering temperature can be lowered to less than 1,000° C., for example 925° C. as disclosed in an example, so as to be below the melting point of the low resistance metal which is about 1,000° C. In view of manufacturing yield of the multilayer wiring substrates, however, it is desirable to further lower the sintering temperature. The green sheet is required to start its shrinkage at a temperature kept as low as possible for matching the shrinkage of the low resistance metal material which starts at 400° C. But in Kumar et al. the green sheet cannot start its shrinkage at a sufficiently low temperature. Further, when the green sheets are used to make the multilayer wiring substrate, resistors are often attached to the green sheets. In this event, the green sheet is desirably selected to be of a sintering temperature matching that of the resistor for simultaneous molding of the resistor on the green sheet with the conductor. While $RuO_2$ series resistors are considered highly reliable, it has been known that their sintering temperature is optimumly in a range of 850° to 900° C., so that the sintering temperature of the green sheet will be lowered below 900° C., preferably to be within the range of 850° to 900° C. Thus, it will be appreciated that the shrink-starting temperatures matched as far as possible between the conductors, resistors and green sheets will result in a higher manufacturing freedom of the wiring pattern and an increased number of layers of the multilayer wiring substrate.

According to Kumar et al., it is an additional problem that, since the raw material may require melting in a crucible heated to about 1,500° C., the crucible must be of a so-called platinum type. Thus, highly expensive manufacturing facilities will be required.

U.S. Pat. No. 4,540,671 to K. Kondo et al. discloses a sintered glass-powder product consisting of 57 to 63 wt % of $SiO_2$, 20 to 28 wt % of $Al_2O_3$, 10 to 18 wt % of MgO, 2 to 6 wt % of ZnO and 0.6 to 6 wt % of $B_2O_3$ and/or $P_2O_5$, which is sintered at a temperature of 900° to 1,000° C., so as to produce therein a microcrystalline cordierite quart solid solution and residual glass. This raw material is melted at a temperature of 1,400° to 1,500° C., allowing the use of a relatively inexpensive, so-called clay crucible.

According to Kondo et al., the melting temperature set for the raw material is below 1,450° C. which makes it possible to use the inexpensive clay crucible and thus to realize inexpensive manufacturing facilities. However, Kondo et al. may still involve such a problem. The sintering temperature for the laminated ceramic substrate is still above 900° C. so that simultaneous sintering of the low resistance conductor wiring pattern and resistor pattern with the green sheets of glass powder will eventually result in easy peeling-off, warp, deformation, etc., in much the same way as in Kumar et al. Thus, the rate of rejection of products will be high.

SUMMARY OF THE INVENTION

A primary object of the present invention is to provide a sintered glass-powder product which can set the melting temperature of raw material below 1,450° C. such that an inexpensive clay crucible can be used and which allows a simultaneous sintering of a low resistance conductor wiring pattern, a resistor pattern and green sheet of glass powder, with much less peeling-off, warp, deformation and the like, and with a good matching between them.

According to the present invention, the above object is attained by providing a sintered glass-powder product having a glass ceramic body of a powdered frit of molten glass material consisting of at least $SiO_2$, $Al_2O_3$, MgO and $B_2O_3$, the powdered frit having been molded into a predetermined shape and sintered. The glass ceramic body preferably consists of 48 to 63 wt % of $SiO_2$, 10 to 25 wt % of $Al_2O_3$, 10 to 25 wt % of MgO and 4 to 10 wt % of $B_2O_3$, and includes a microstructure of a primary crystalline phase of alpha-cordierite and a secondary crystalline phase of magnesium aluminum silicate ($MgO.Al_2O_3.4SiO_2$) which are homogeneously dispersed in the glass ceramic body.

Other objects and advantages of the present invention shall be made clear in the following description of the invention detailed with reference to various examples thereof with a use of accompanying drawings.

DETAILED DESCRIPTION OF THE PREFERRED EMBODIMENTS

Figure 1:
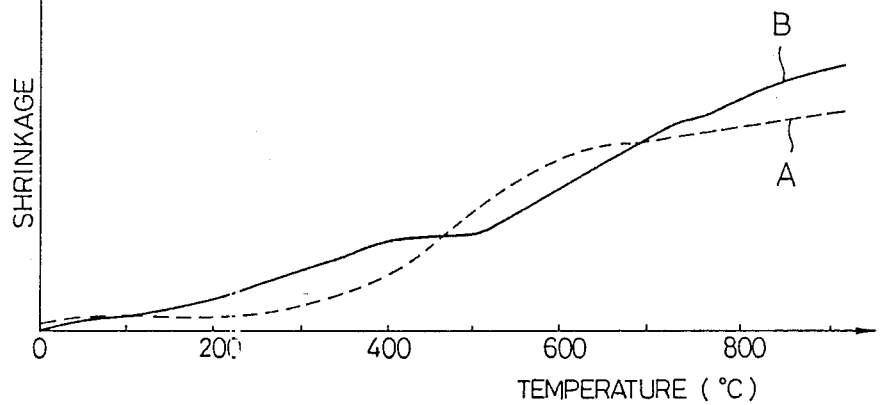
FIG. 1 is a graph showing a relationship between the temperature and the shrinkage of a low resistance metal wiring material, in which a curve A is for Au and a curve B is for Ag-Pd alloy (Ag:80 wt %, Pd:20 wt %)

While the present invention shall now be described with reference to the preferred embodiments, it should be understood that the intention is not to limit the invention only to the particular embodiments disclosed but rather to cover all alterations, modifications and equivalent arrangements possible within the scope of the claims.

The term "glass ceramic body" is hereinafter used for the sintered glass-powder product and means a product which comprises two crystalline components which are separated out upon the sintering of the glass powder, alpha-cordierite and magnesium aluminum silicate ($MgO.Al_2O_3.4SiO_2$), as well as glass of non-crystalline components.

The sintered glass-powder product according to the present invention employs a raw material which is of a nominal composition of 48 wt % $\leq SiO_2 \leq$ 63 wt %, 10 wt % $\leq Al_2O_3 \leq$ 25 wt %, 10 wt % $\leq MgO \leq$ 25 wt %, and 4 wt % $\leq B_2O_3 \leq$ 10 wt %, and its basic idea is to remarkably lower the required sintering temperature for the material. The sintered product is obtained by melting the raw material to obtain a frit, crushing the frit into fine powder, molding the powder into a predetermined shape, in particular, into a sheet, and sintering the sheet.

With $SiO_2$, $Al_2O_3$, MgO and $B_2O_3$ in the foregoing composition ranges, the sintering temperature can be about 850° C., and at least below 900° C., and a non-porous crystallization can be realized in the product. The glass ceramic body of the thus sintered glass-powder product comprises a microstructure of alpha-cordierite as a primary crystalline phase and magnesium aluminum silicate ($MgO.Al_2O_3.4SiO_2$) as a secondary crystalline phase, both of which are homogeneously dispersed in the structure. Since the primary crystalline phase comprises cordierite, the permittivity can be lowered while the mechanical strength can be made higher.

In fritting the raw material, the respective components set to be in the above composition ranges allows for the melting temperature for processing the raw materials to be about 1,400° C. and at least below 1,450° C., so that the crucible or melting furnace forming a part of the main manufacturing facilities can be the so-called clay crucible, thus rendering the manufacturing facilities inexpensive.

Referring to reasons why the raw material components are set to be in the foregoing composition ranges: the $SiO_2$ content of a composition exceeding 63 wt % has an adverse effect on the density of the sintered product, whereas a composition containing below 48 wt % necessitates an increase in the sintering temperature for realizing the crystallization to above about 950° C. since crystallization becomes insufficient at a temperature below 900° C.; with the $Al_2O_3$ content of a composition exceeding 25 wt %, the sintering temperature for crystallization must be increased to above about 950° C. since it is impossible to realize sufficient crystallization below 900° C., whereas a composition containing below 10 wt % lowers the formation of alpha-cordierite crystals, adversely affects $SiO_2$-MgO series crystal separation, and elevates the dielectric constant; with an MgO content exceeding 25 wt %, the sintered product shows a tendency of foaming and, as a result, the sintered product becomes practically unusable, due probably to a separation of magnesium silicate, whereas a composition containing below 10 wt % results in difficulties in obtaining a dense sintered product; with a $B_2O_3$ content exceeding 10 wt %, the glass phase increases and exhibits foaming while rendering the sintering temperature range for the crystallization narrower and the mechanical strength of the product insufficient and therefore not practically utilizable; a composition below 4 wt % of $B_2O_3$ causes the melting temperature to exceed 1,500° C. so that the crystallization at the surface layer of glass powder is much faster than other parts and the density of the sintered product is adversely affected.

According to another feature of the present invention, the crystallization is further promoted by adding a nucleant. In this case, the nucleant may be $TiO_2$, $ZrO_2$, $MoO_3$, $P_2O_5$ or $As_2O_3$ and may be added in an amount of less than 5 wt %, since the nucleant of an amount exceeding 5 wt % abruptly accelerates the crystallization and the sintered product which adversely affects its density.

EXAMPLES 1 to 8

Raw material components of oxides of such composition as given in Table 1 were placed in a clay crucible and either heated at about 1,400° C. or heated at about 1,450° C. to be melted. The melt was put in water to obtain a transparent glass frit, which was then sufficiently crushed in an alumina ball mill to form glass powder having an average size of 1 to 10 μm. Thereafter, one or more of poly-butyl methacrylate resin, dibutyl phthalate and toluene were added to the crushed glass powder and milled and defoamed under a vacuum to obtain a slurry. This slurry was subjected to the doctor blade process, and a continuous dry sheet 0.2 mm thick was formed on a film sheet. The dry sheet was released from the film sheet and then blank-molded to obtain green sheets.

Subsequently, through-holes were made in the green sheets, and a wiring pattern of a low resistance metal material was applied on each of the green sheets. A plurality of such green sheets were stacked and press-molded to form a molded assembly. The assembly was heated up to 500° C. at a heating rate of 150° C. per hour and kept at 500° C. for 2 hours and 45 minutes to eliminate organic materials. Then the assembly was heated to a sintering temperature given in Table 1 at a rate of 200° C. per hour and kept at the sintering temperature for 3 hours to sinter the green sheets. The assembly was cooled down to 400° C. at a cooling rate of 110 C. per hour and thereafter left to be spontaneously cooled to obtain a multilayer wiring substrate.

EXAMPLES 9 to 13

Substantially the same processing steps as those employed in the foregoing EXAMPLES 1 to 8 were carried out to obtain multilayer wiring substrates, except for the addition of such nucleants as given in Table 1.

COMPARATIVE EXAMPLES 1 to 3

Oxides having such composition as in Table 1 (in COMPARATIVE EXAMPLE 3 only, with an addition of a nucleant) were mixed to obtain a raw material, which was subjected to substantially the same processing steps as employed in the foregoing EXAMPLES 1 to 8 to obtain multilayer wiring substrates.

and that EXAMPLES 1 to 13 provide a sufficiently small dielectric constant to allow the resultant products to be practically utilized satisfactorily, without any substantial warp that adversely affects the wiring patterns. It has been also found that the melting temperature of the raw mateial is about 1,400° C. or lower except for EXAMPLES 3 and 4 which show about 1,450° C.

In COMPARATIVE EXAMPLES 2 and 3 particularly, only sintering at temperatures above 950° C. can produce a dense glass ceramic body, since otherwise a large warp causes a distortion to be seen in the wiring pattern.

Figure 2:
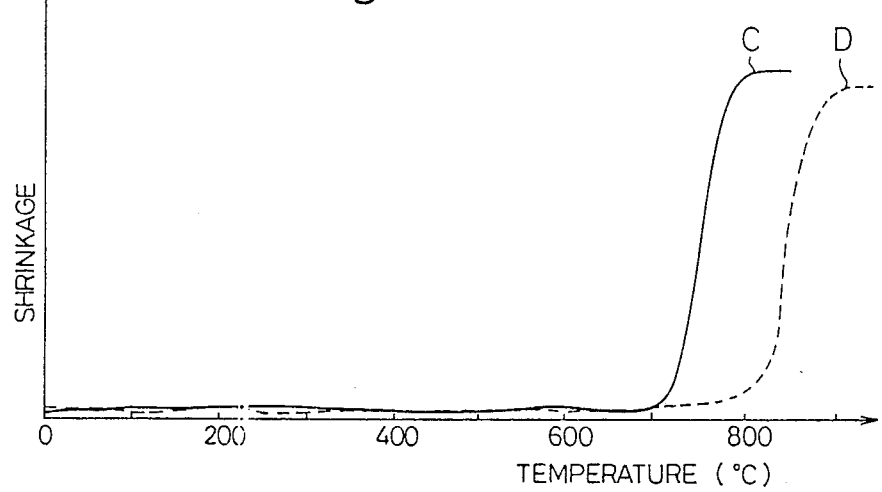
FIG. 2 is a graph showing a relationship between the temperature and the shrinkage of a sintered glass-powder product, according to an example of the present invention (solid-line curve C) and of a known product according to a comprative example (dotted-line curve D).

Referring here to FIGS. 1 and 2, Au starts its shrinkage from 400° C., as shown by the dotted-line Curve A in FIG. 1, whereas the molded assembly in EXAMPLE 2 starts to shrink when the temperature exceeds 700° C. as shown by the solid-line curve C in FIG. 2. On the other hand, the molded assembly obtained in COMPARATIVE EXAMPLE 3 starts to shrink when the temperature exceeds 800° C. as shown by the dotted-line curve D in FIG. 2. Therefore, it will be readily appreciated that, since the assembly of EXAMPLE 2 starts to shrink at a temperature substantially lower than the shrinkage starting temperature of COMPARATIVE EXAMPLE 3, the match between the assembly and the low-resistance metallic wiring pattern is excellent in the EXAMPLE 2 assembly.

TABLE 1

| Raw Mat. Comp. (wt %) | EXAMPLES | | | | | | | | | | | | | COMPARATIVE EXAMPLES | | |
|---|---|---|---|---|---|---|---|---|---|---|---|---|---|---|---|---|
| | No. 1 | 2 | 3 | 4 | 5 | 6 | 7 | 8 | 9 | 10 | 11 | 12 | 13 | 1 | 2 | 3 |
| SiO$_2$ | 57.1 | 57.1 | 57.1 | 52.4 | 52.4 | 54.5 | 54.6 | 50.0 | 56.1 | 53.5 | 49.1 | 50.0 | 54.5 | 40.0 | 60.0 | 52.5 |
| Al$_2$O$_3$ | 14.3 | 19.0 | 23.8 | 23.8 | 19.0 | 18.2 | 22.7 | 18.2 | 18.7 | 17.9 | 22.3 | 18.2 | 13.6 | 25.0 | 20.0 | 21.84 |
| MgO | 23.8 | 19.1 | 14.3 | 19.0 | 23.8 | 18.2 | 13.6 | 22.7 | 18.7 | 17.9 | 17.9 | 22.7 | 22.7 | 25.0 | 18.0 | 24.0 |
| B$_2$O$_3$ | 4.8 | 4.8 | 4.8 | 4.8 | 4.8 | 9.1 | 9.1 | 9.1 | 4.7 | 8.9 | 8.9 | 4.55 | 4.6 | 10.0 | 2.0 | 0.5 |
| TiO$_2$ | — | — | — | — | — | — | — | — | — | — | 1.8 | — | 0.5 | — | — | — |
| ZrO$_2$ | — | — | — | — | — | — | — | — | — | 0.8 | — | — | 0.5 | — | — | — |
| MoO$_3$ | — | — | — | — | — | — | — | — | — | — | — | 1.0 | — | — | — | — |
| P$_2$O$_5$ | — | — | — | — | — | — | — | — | 1.8 | 1.0 | — | 3.55 | 3.6 | — | — | 1.16 |
| Sint. Temp. (°C.) | 900 | 850 | 900 | 850 | 800 | 850 | 850 | 800 | 850 | 830 | 825 | 830 | 850 | 850 | 950 | 970 |
| Moist. Absorp. (wt %) | 0.0 | 0.0 | 0.3 | 0.0 | 0.2 | 0.0 | 0.0 | 0.0 | 0.0 | 0.2 | 0.0 | 0.0 | 0.0 | 21.0 | 3.1 | 0.1 |
| Spec. Permit. | 6.5 | 5.8 | 6.1 | 6.2 | 5.6 | 6.0 | 6.5 | 6.4 | 5.9 | 5.7 | 6.3 | 6.6 | 6.3 | — | — | 5.7 |
| Warp (Au paste) | G | VG | G | VG | VG | VG | VG | VG | VG | VG | VG | VG | G | VG | B | B |
| Major Cryst. Phase | α-cord. m.a.s. | " " | " " | " " | " " | " " | " " | " " | " " | " " | " " | " " | " " | forsterite enstatite | α-cord. cristobarite | " enstatite |
| Glass Melt Temp.(°C.) | 1400 | 1400 | 1450 | 1450 | 1400 | 1400 | 1400 | 1400 | 1400 | 1400 | 1400 | 1400 | 1400 | 1550 | 1500 | 1550 |

The resulting multilayer wiring substrates of EXAMPLES 1 through 13 and COMPARATIVE EXAMPLES 1-3 were subjected to measurements of moisture absorption (wt %) and dielectric constant at a measuring frequency of 1 MHz in accordance with JIS C-2141, the results of which have been as given in Table 1, in which presence or absence of warp in the substrates after being sintered is also shown by an appearance evaluation in respect to a case where the wiring pattern is made of Au paste, with representation of VG, G and B indicative of "Very Good" (no warp), "good" (small warp enough for being used) and "bad" (too large warp to be used), respectively. Table 1 also shows the primary crystalline phase and melting temperature of the raw materials.

As will be clear from Table 1, it has been found that, in EXAMPLES 1 to 13, the sintering at temperatures below 900° C. produces a highly dense crystallization, According to still another feature of the present invention, the permittivity can be lowered by substituting 3 to 20 wt % (with respect to amount of MgO) of such alkaline earth metal oxides as BaO, SrO, or CaO. In order to obtain an excellent crystallization, a nucleant is properly added as required. By adding less than 5 wt % of and preferably 0.5 to 2 wt % of nucleant, alpha-cordierite crystals can be reliably obtained during the sintering. In addition to the above, the nucleant may be SnO$_2$, Ta$_2$O$_5$, Nb$_2$O$_5$, or As$_2$O$_3$.

When the percentage of substituting oxide for MgO exceeds 20 wt %, the MgO component becomes too small, the separation of alpha-cordierite crystals becomes poor, and the electrical characteristics deteriorate. When the substituting oxide is below 3 wt %, there is no lowering effect in the permittivity. As has been already referred to, the addition of nucleant in excess of 5 wt % causes the crystallizing rate to become too fast.

EXAMPLES 14 to 27

One or more of BaO, CaO, and SrO were added in the amounts disclosed in Table 2, with one or more nucleants added in most of EXAMPLES 16–18, 21 and 23–27 to obtain a raw glass material. The thus obtained glass material was subjected to substantially the same processing steps as those in the foregoing EXAMPLES 1 to 8 to obtain multilayer wiring substrates.

The obtained substrates were measured in respect to the moisture absorption and dielectric constant in the same manner as in the foregoing EXAMPLES 1 to 13, together with an appearance evaluation, VG and G having the same meaning as in Table 1. Further, the crystalline phase and melting temperature of the raw material were also given in Table 2.

As illustrated in Table 2, sintering at temperatures below 900° C. produced highly dense crystallization and excellent specific permittivities that are remarkably improved as compared with those in EXAMPLES 1 to 13. There was substantially no warp in the substrates and the wiring patterns were not deteriorated. In addition, the melting temperature of the raw material was below about 1,400° C. except for EXAMPLES 23 and 27 which were 1,450° C.

$B_2O_3$, wherein said material melts at a temperature below 1450° C. and is sinterable at a temperature below 900° C. where said glass ceramic body has a microstructure that includes a primary crystalline phase alpha-cordierite and a secondary crystalline phase magnesium aluminum silicate ($MgO.Al_2O_3.4SiO_2$) which are homogeneously dispersed in said glass ceramic body.

2. A sintered product according to claim 1, wherein said material is in the form of a glass powder prior to being sintered, said powder being of an average size of 1 to 10 $\mu m$.

3. A sintered product according to claim 1, wherein 3 to 20 wt % of MgO is replaced by an alkaline earth metal oxide.

4. A sintered product according to claim 3, wherein said alkaline earth metal oxide is one or more selected from a group consisting of BaO, SrO and CaO.

5. A sintered product acording to claim 3, wherein one or more nucleants selected from a group consisting of $TiO_2$, $ZrO_2$, $MoO_3$, $P_2O_5$, $As_2O_3$, $SnO_2$, $Ta_2O_5$ and $Nb_2O_5$ in an amount of less than 5 wt %, is further added to said material.

6. A sintered product according to claim 1, wherein a nucleant selected from a group consisting of $TiO_2$, $ZrO_2$, $MoO_3$, $P_2O_5$, $As_2O_3$, $SnO_2$, $Ta_2O_5$ and $Nb_2O_5$ is added to said material.

7. A sintered product according to claim 6, wherein said nucleant is added to said material by less than 5 wt %.

TABLE 2

| Raw Mat Comp. (wt %) | EXAMPLES | | | | | | | | | | | | | |
|---|---|---|---|---|---|---|---|---|---|---|---|---|---|---|
| | 14 | 15 | 16 | 17 | 18 | 19 | 20 | 21 | 22 | 23 | 24 | 25 | 26 | 27 |
| Main Comp.: | | | | | | | | | | | | | | |
| $SiO_2$ | 57.2 | 57.2 | 56.0 | 56.0 | 53.6 | 52.4 | 52.4 | 49.1 | 50.0 | 51.4 | 49.1 | 56.1 | 56.1 | 56.1 |
| $Al_2O_3$ | 19.0 | 19.0 | 18.7 | 18.7 | 17.8 | 19.0 | 19.0 | 17.9 | 18.2 | 23.3 | 22.3 | 18.7 | 14.0 | 23.3 |
| $B_2O_3$ | 4.8 | 4.8 | 4.7 | 4.7 | 8.9 | 4.8 | 4.8 | 8.9 | 9.1 | 4.7 | 8.9 | 4.7 | 4.7 | 4.7 |
| MgO | 17.1 | 15.2 | 16.8 | 14.9 | 16.1 | 21.4 | 21.4 | 20.1 | 18.3 | 16.8 | 16.1 | 17.7 | 21.0 | 12.6 |
| Subst. Oxide: | | | | | | | | | | | | | | |
| BaO | 1.9 | 1.9 | — | 1.9 | 1.8 | — | 2.4 | — | 2.2 | 1.9 | — | 0.9 | 1.2 | 0.7 |
| CaO | — | 1.9 | — | — | — | 2.4 | — | 2.2 | 2.2 | — | — | — | 1.2 | 0.7 |
| SrO | — | — | 1.9 | 1.9 | — | — | — | — | — | — | 1.8 | — | — | — |
| Nucleant: | | | | | | | | | | | | | | |
| $P_2O_5$ | — | — | 1.9 | 1.9 | 1.8 | — | — | 1.0 | — | — | — | 1.9 | 1.2 | 1.0 |
| $TiO_2$ | — | — | — | — | — | — | — | 0.8 | — | 1.9 | — | — | — | — |
| $SnO_2$ | — | — | — | — | — | — | — | — | — | — | 1.8 | — | — | 0.9 |
| $ZrO_2$ | — | — | — | — | — | — | — | — | — | — | — | — | 0.6 | — |
| Subst. Oxide Percent. (wt %) | 10 | 20 | 10 | 20 | 10 | 10 | 10 | 10 | 20 | 10 | 10 | 5 | 20 | 10 |
| Sint. Temp. (°C.) | 900 | 900 | 900 | 900 | 875 | 875 | 875 | 875 | 875 | 875 | 875 | 900 | 850 | 875 |
| Moist. Absorp. (%) | 0 | 0 | 0.3 | 0.2 | 0.1 | 0.1 | 0 | 0.1 | 0.2 | 0 | 0 | 0 | 0.2 | 0.3 |
| Spec. Permit. | 5.8 | 5.7 | 5.9 | 5.4 | 6.0 | 5.9 | 5.8 | 5.7 | 5.6 | 5.5 | 5.9 | 5.7 | 5.4 | 5.6 |
| Warp (Au paste) | G | G | G | G | VG | VG | VG | VG | VG | VG | VG | G | VG | VG |
| Major Cryst. Phase | α-cord. m.a.s. | " " | " " | " " | " " | " " | " " | " " | " " | " " | " " | " " | " " | " " |
| Glass Melt. Temp. (°C.) | 1400 | 1400 | 1400 | 1400 | 1400 | 1400 | 1400 | 1400 | 1400 | 1450 | 1400 | 1400 | 1400 | 1450 |

What is claimed as our invention is:

1. A sintered glass-ceramic body consisting essentially of 48 to 63 wt % of $SiO_2$, 10 to 25 wt % of $Al_2O_3$, 10 to 25 wt % or MgO and 4 to less than 10 wt % of

* * * * *